United States Patent
Kinoshita et al.

(10) Patent No.: US 8,581,302 B2
(45) Date of Patent: Nov. 12, 2013

(54) SEMICONDUCTOR DEVICE INCLUDING CHIP WITH COMPLEMENTARY I/O CELLS

(75) Inventors: Mitsuya Kinoshita, Kanagawa (JP); Motoo Suwa, Kanagawa (JP); Akinobu Watanabe, Kanagawa (JP); Shigezumi Matsui, Kanagawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 32 days.

(21) Appl. No.: 13/295,053

(22) Filed: Nov. 12, 2011

(65) Prior Publication Data

US 2012/0126403 A1      May 24, 2012

(30) Foreign Application Priority Data

Nov. 19, 2010   (JP) ................................. 2010-258904

(51) Int. Cl.
*H01L 27/118* (2006.01)

(52) U.S. Cl.
USPC ............................. 257/203; 257/208; 257/737

(58) Field of Classification Search
USPC .......... 254/203, 208, 737, E23.068, E31.111, 254/E27.11; 257/203, 208, 737, E23.068, 257/E31.111, E27.11
See application file for complete search history.

(56) References Cited

U.S. PATENT DOCUMENTS

| | | | | | |
|---|---|---|---|---|---|
| 5,060,046 | A | * | 10/1991 | Shintani | 257/206 |
| 5,300,796 | A | * | 4/1994 | Shintani | 257/203 |
| 5,365,091 | A | * | 11/1994 | Yamagishi | 257/203 |
| 7,408,209 | B2 | * | 8/2008 | Hoshi | 257/203 |

FOREIGN PATENT DOCUMENTS

| | | | |
|---|---|---|---|
| JP | 58071650 A | * | 4/1983 |
| JP | 6-45566 A | | 2/1994 |

* cited by examiner

*Primary Examiner* — Jae Lee
(74) *Attorney, Agent, or Firm* — Miles & Stockbridge P.C.

(57) ABSTRACT

Signals outputted from an I/O buffer with a parallel drive configuration are stabilized for reliability enhancement. Each I/O cell has a complementary I/O cell that outputs one output signal as a complementary signal made up of a non-inverted signal and an inverted signal. Two I/O cells are coupled in parallel. Output portions of first inverters are coupled together through a first wiring; and output portions of second inverters are coupled together through a second wiring. The first wiring is formed on the lower side of the I/O cells so that it is astride the two I/O cells, and the second wiring is formed above the first wiring so that it is astride the two I/O cells. The wirings are laid out so that the wiring length of the first wiring and the wiring length of the second wiring are substantially equal to each other.

6 Claims, 12 Drawing Sheets

SEMICONDUCTOR DEVICE INCLUDING CHIP WITH COMPLEMENTARY I/O CELLS

CROSS-REFERENCE TO RELATED APPLICATIONS

The disclosure of Japanese Patent Application No. 2010-258904 filed on Nov. 19, 2010 including the specification, drawings and abstract is incorporated herein by reference in its entirety.

BACKGROUND

The present invention relates to technologies for enhancing the reliability of I/O (Input/Output) cells and in particular to a technology effective in stabilizing output signals in I/O cells with a parallel drive configuration in which two I/O cells are coupled in parallel.

In electronic systems, such as personal computers, digital cameras, and car navigation systems, such a volatile semiconductor memory as DRAM (Dynamic Random Access Memory) is widely used as a storage device.

In personal computers, for example, multiple volatile semiconductor memories are mounted over a board designated as memory module board. The read/write operation of the volatile semiconductor memories is controlled by a memory controller unit provided in a semiconductor device provided externally to the memory module board.

In a personal computer, for example, a memory module board mounted with multiple volatile semiconductor memories is coupled through a connector of a main board. The read/write operation of the volatile semiconductor memories is controlled by a memory controller unit provided in a semiconductor device mounted over this main board.

In digital cameras, car navigation systems, and the like, meanwhile, it is unnecessary to expand memories. Therefore, they are provided with a so-called on-board configuration and multiple volatile semiconductor memories and a memory controller unit for controlling the read/write operation of the volatile semiconductor memories are placed over an identical board.

As an I/O cell (I/O buffer) provided in a memory controller unit, so-called complementary I/O cell is known. In the complementary I/O cell, for example, one output signal is outputted as a complementary signal made up of a non-inverted signal and its inverted signal.

As this type of I/O cell, one in which the following is implemented is known: an input/output buffer with high driving capability, power supply cell accommodating to high currents, or the like is realized by causing multiple input/output cells to do output. (Refer to Patent Document 1, for example.)

[Patent Document 1]
Japanese Unexamined Patent Publication No. Hei 6 (1994)-45566

SUMMARY

However, the present inventors found that such driving technologies for volatile semiconductor memories by I/O cells involved the following problem:

In the above-mentioned volatile semiconductor memories with an on-board configuration, a memory is not expanded and a memory and a memory controller unit are placed over an identical board. Therefore, an I/O cell having driving capability most suitable for the volatile semiconductor memories can be selected.

Meanwhile, in a configuration in which a memory module board is coupled to a main board through a connector, the load capacity and the like may vary. If an I/O cell used in the on-board configuration is used in this configuration, there is a possibility that the driving capability of the I/O cell becomes insufficient.

Especially, when the number of volatile semiconductor memories mounted over a memory module board or the like is significantly increased or decreased, the load capacity is also significantly varied accordingly. This eventually cannot be coped with.

To eliminate a deficiency of the driving capability of an I/O cell, it is necessary to newly design an I/O cell with higher driving capability. This increases a number of man-hours, lengthens a time required for designing, and increases a cost and it is not realistic.

To cope with this, technologies for increasing a driving current in a complementary I/O cell, using an existing I/O cell have been developed. As one of such technologies, a technology in which two complementary I/O cells are coupled in parallel is known.

The complementary I/O cell includes a non-inversion inverter portion that outputs non-inverted signals and an inversion inverter portion that outputs their inverted signals.

To couple complementary I/O cells in parallel, a configuration is possible. In this configuration, the output portions of the non-inversion inverter portions provided in two adjoining complementary I/O cells are respectively coupled to a non-inverted signal pad for outputting non-inverted signals; and further, the output portions of the inversion inverter portions respectively provided in the two complementary I/O cells are coupled to an inverted signal pad for outputting inverted signals.

However, wiring and coupling are carried out without paying any attention to the coupling of the output portions of the non-inversion inverter portion or the output portions of the inversion inverter portions. As a result, there is a possibility that signal delay or the like is caused by uneven wiring length.

There is a possibility that this leads to the occurrence of failure in reading/writing from/to a volatile semiconductor memory and this poses a problem of the degraded reliability of an electronic system.

It is an object of the invention to provide a technology in which it is possible to stabilize signals outputted from an I/O buffer with a parallel drive configuration including two I/O cells coupled in parallel and enhance reliability.

The above and other objects and novel features of the invention will be apparent from the description in this specification and the accompanying drawings.

The following is a brief description of the gist of the representative elements of the invention laid open in this application:

The invention includes: a semiconductor chip having a main surface; multiple input/output circuit cells formed along the periphery of the main surface; internal circuits formed in the main surface so that they are surrounded with the input/output circuit cells; and multiple electrode pads placed in areas respectively corresponding to the input/output circuit cells. Each of the input/output circuit cell includes a first input/output circuit cell and a second input/output circuit cell placed adjacently to each other. It has a first electrode pad and a second electrode pad placed in areas respectively corresponding to the first and second input/output circuit cells with a predetermined distance in between. Each of the first and second input/output circuit cells includes a first inverter circuit and a second inverter circuit that output complementary signals different in phase from each other according to an identical signal outputted from an internal circuit. The output of the first inverter circuit of the first input/output circuit cell and the output of the first inverter circuit of the second input/output circuit cell are coupled in common to the first electrode pad through a first wiring located below the wiring layer making up an electrode pad. The output of the second inverter circuit of the first input/output circuit cell and the output of the second inverter circuit of the second input/output circuit cell are coupled in common to the second electrode pad through a second wiring formed in the same layer, as the first wiring. The first electrode pad is placed between the output of the first inverter circuit of the first input/output circuit cell and the output of the first inverter circuit of the second input/output circuit cell in the direction along the periphery of the semiconductor chip. The second electrode pad is placed between the output of the second inverter circuit of the first input/output circuit cell and the output of the second inverter circuit of the second input/output circuit cell in the direction along the periphery of the semiconductor chip. The first wiring coupling together the first electrode pad and the output of the first inverter circuit of the second input/output circuit cell is so formed that it is astride the areas where the first and second input/output circuit cells are formed. The second wiring coupling together the second electrode pad and the output of the second inverter circuit of the first input/output circuit cell is so formed that it is astride the areas where the first and second input/output circuit cells are formed.

According to the invention, a power supply cell is formed between the first and second input/output circuit cells. The first wiring coupling together the first electrode pad and the output of the first inverter circuit of the second input/output circuit cell is so formed that it traverses the area located over the power supply cell. The second wiring coupling together the second electrode pad and the output of the second inverter circuit of the first input/output circuit cell is so formed that it traverses the area located over the power supply cell.

The following is a brief description of the gist of the other elements of the invention laid open in this application:

According to the invention, the first and second electrode pads are placed on both side of the power supply cell with the power supply cell in between.

According to the invention, the first and second electrode pads are formed of a metal film predominantly comprised of aluminum.

According to the invention, rewiring layers respectively coupled the first and second electrode pads are further included and solder bumps are formed over the rewiring layers.

According to the invention, the identical signal outputted from an internal circuit is a clock signal.

The following is a brief description of the gist of the effect obtained by the representative elements of the invention laid open in this application:

(1) Signals outputted from an I/O cell with a parallel drive configuration can be provided with a stable waveform with less noise and the like.

(2) The reliability of a semiconductor device can be enhanced because of Section (1) above.

DETAILED DESCRIPTION

Figure 1:
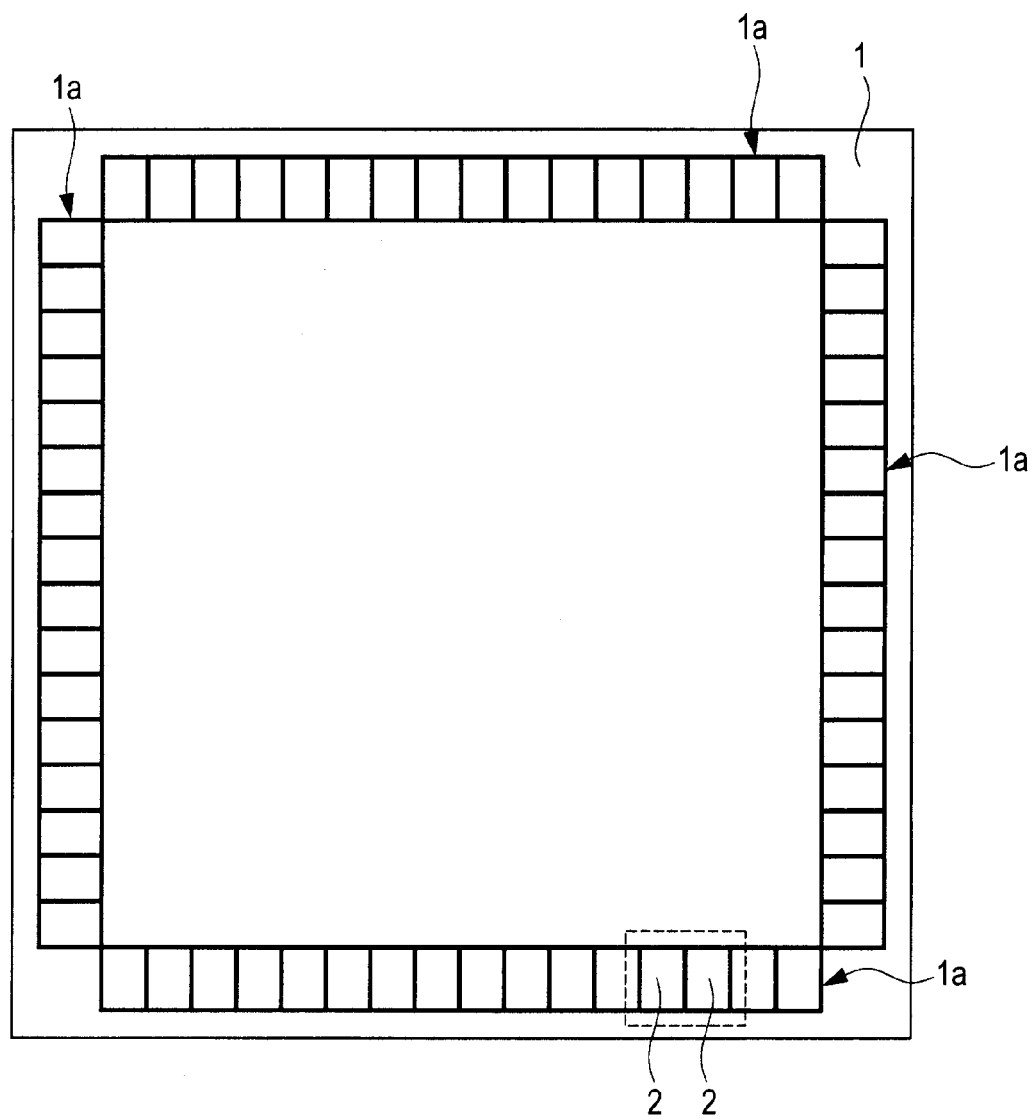
FIG. 1 is an explanatory drawing illustrating an example of the layout of I/O regions provided in a semiconductor chip in a first embodiment of the invention.

Hereafter, detailed description will be given to embodiments of the invention with reference to the drawings. In every drawing for explaining the embodiments, the same members will be marked with the same reference numerals as a rule and the description thereof will be omitted.

<<Overview of the Invention>>

A semiconductor device of the invention includes: a semiconductor chip (semiconductor chip 1) having a main surface; multiple input/output circuit cells (I/O cells 2) formed along the periphery of the main surface; internal circuits formed in the main surface so that they are surrounded with the input/output circuit cells; and multiple electrode pads placed in areas respectively corresponding to the input/output circuit cells.

The input/output circuit cells include a first input/output circuit cell and a second input/output circuit cell placed adjacently to each other. It includes a first electrode pad (area bump terminal padT) and a second electrode pad (area bump terminal padcT) placed with a predetermined distance in between in areas respectively corresponding to the first and second input/output circuit cells.

Each of the first and second input/output circuit cells include a first inverter circuit (inverter 5, inverter 6) and a second inverter circuit (inverter 7) that output complementary signals different in phase from each other according to an identical signal outputted from the internal circuits. The output of the first inverter circuit of the first input/output circuit cell and the output of the first inverter circuit of the second input/output circuit cell are coupled in common to the first electrode pad through a first wiring (wiring 17) located below the wiring layer forming the electrode pad. The output of the second inverter circuit of the first input/output circuit cell and the output of the second inverter circuit of the second input/output circuit cell are coupled in common to the second electrode pad through a second wiring (wiring 18) formed in the same layer as the first wiring.

The first electrode pad is placed between the output of the first inverter circuit of the first input/output circuit cell and the output of the first inverter circuit of the second input/output circuit cell in the direction along the periphery of the semiconductor chip. The second electrode pad is placed between the output of the second inverter circuit of the first input/output circuit cell and the output of the second inverter circuit of the second input/output circuit cell in the direction along the periphery of the semiconductor chip. The first wiring coupling together the first electrode pad and the output of the first inverter circuit of the second input/output circuit cell is so formed that it is astride the areas where the first and second input/output circuit cells are formed.

The second wiring coupling together the second electrode pad and the output of the second inverter circuit of the first input/output circuit cell is so formed that it is astride the areas where the first and second input/output circuit cells.

First Embodiment

Figure 2:
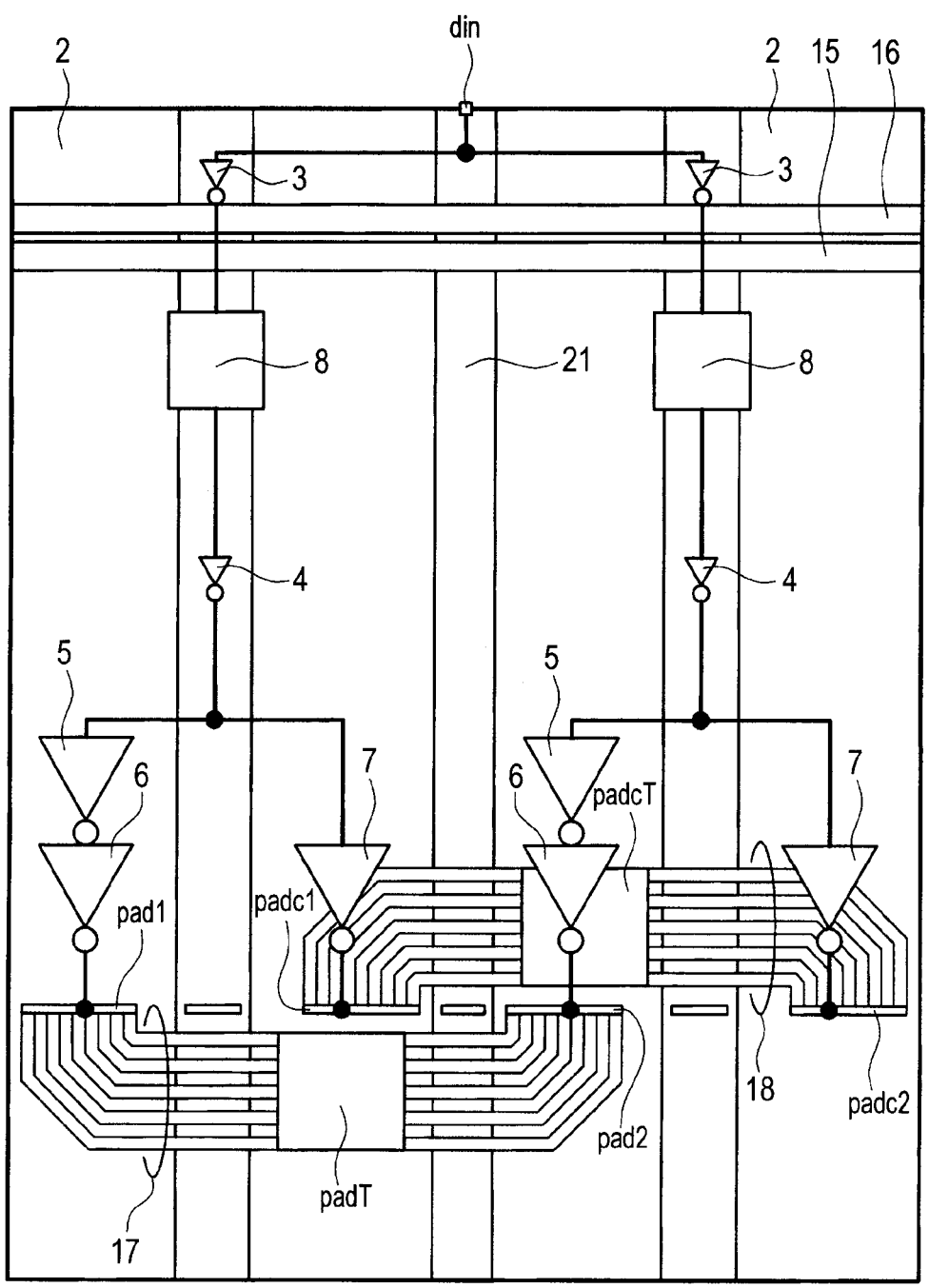
FIG. 2 is an explanatory drawing illustrating an example of the configuration of two I/O cells provided in one of the I/O regions in FIG. 1.
Figure 3:
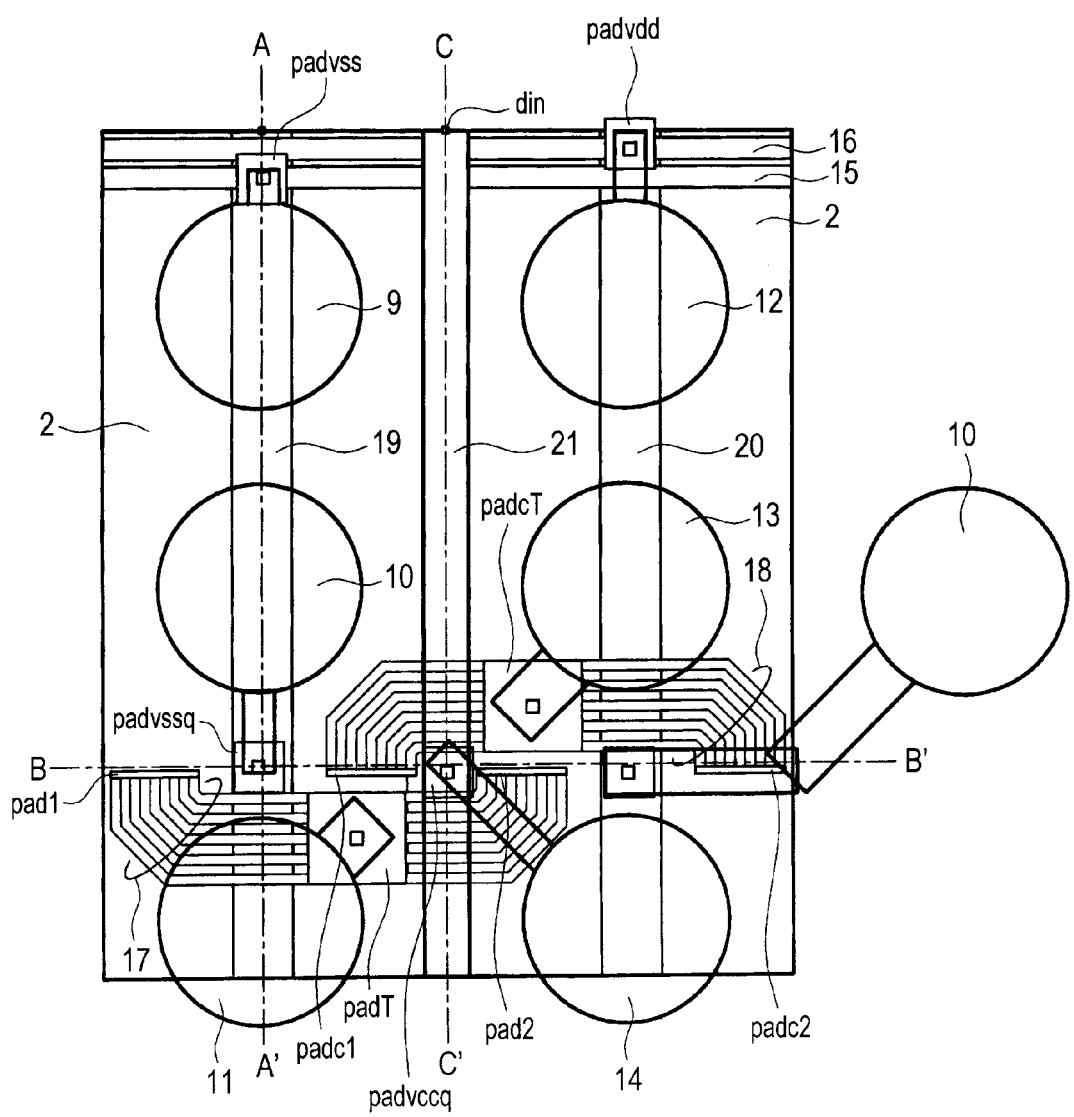
FIG. 3 is an explanatory drawing illustrating an example of the layout of the area where the I/O cells in FIG. 2 are placed.
Figure 4:
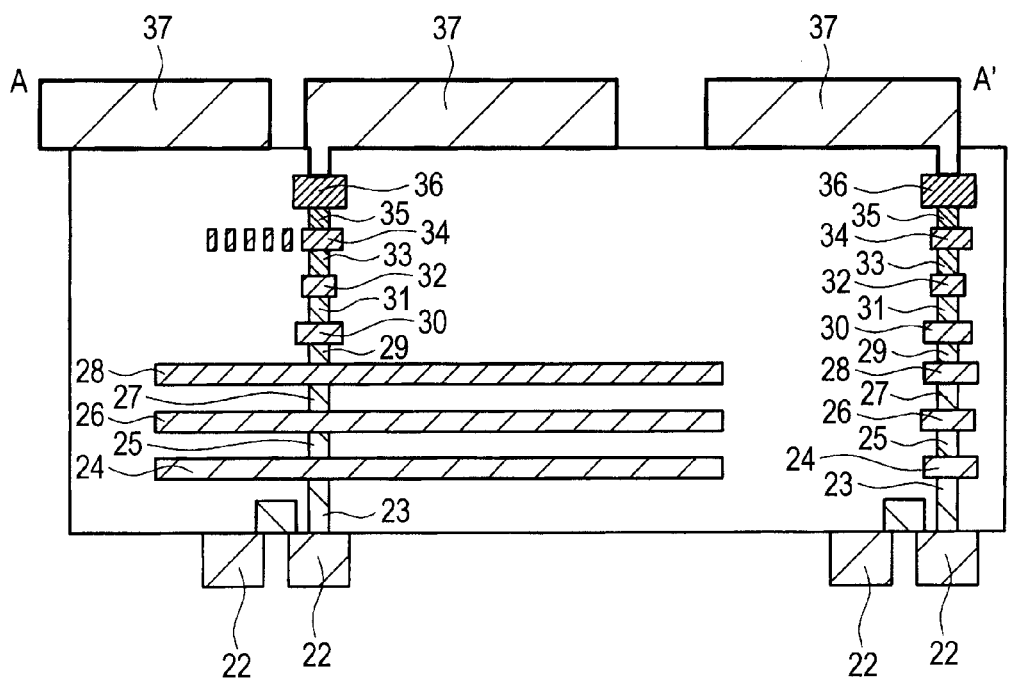
FIG. 4 is an explanatory drawing schematically illustrating a section taken along line A-A' of FIG. 3.
Figure 5:
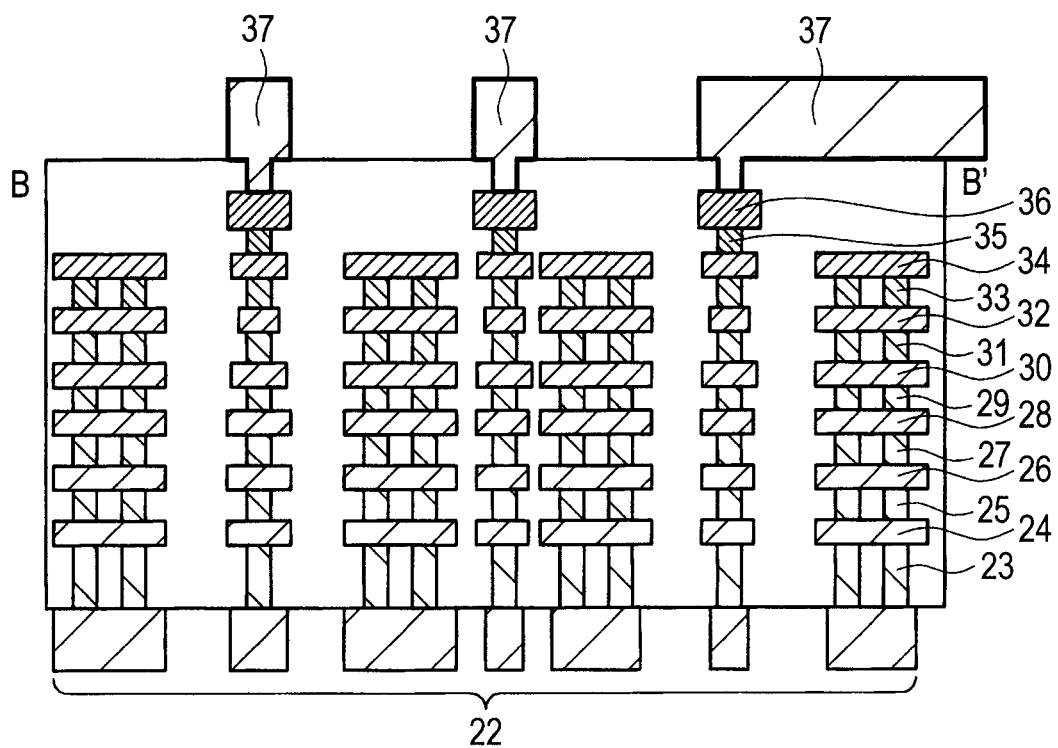
FIG. 5 is an explanatory drawing schematically illustrating a section taken along line B-B' of FIG. 3.
Figure 6:
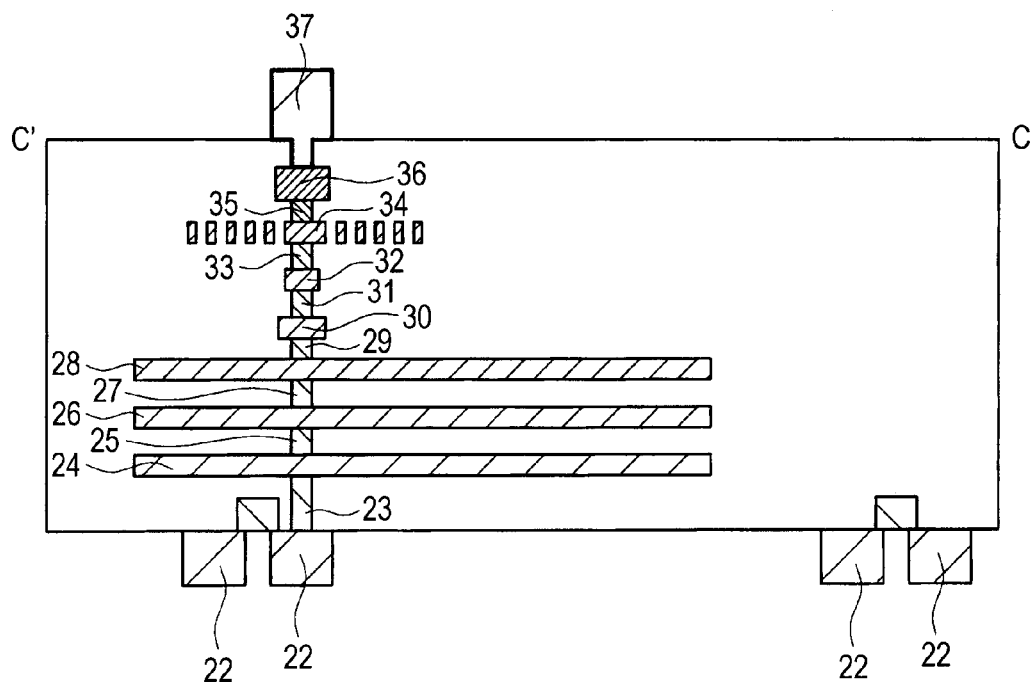
FIG. 6 is an explanatory drawing schematically illustrating a section taken along line C-C' of FIG. 3.
Figure 7:
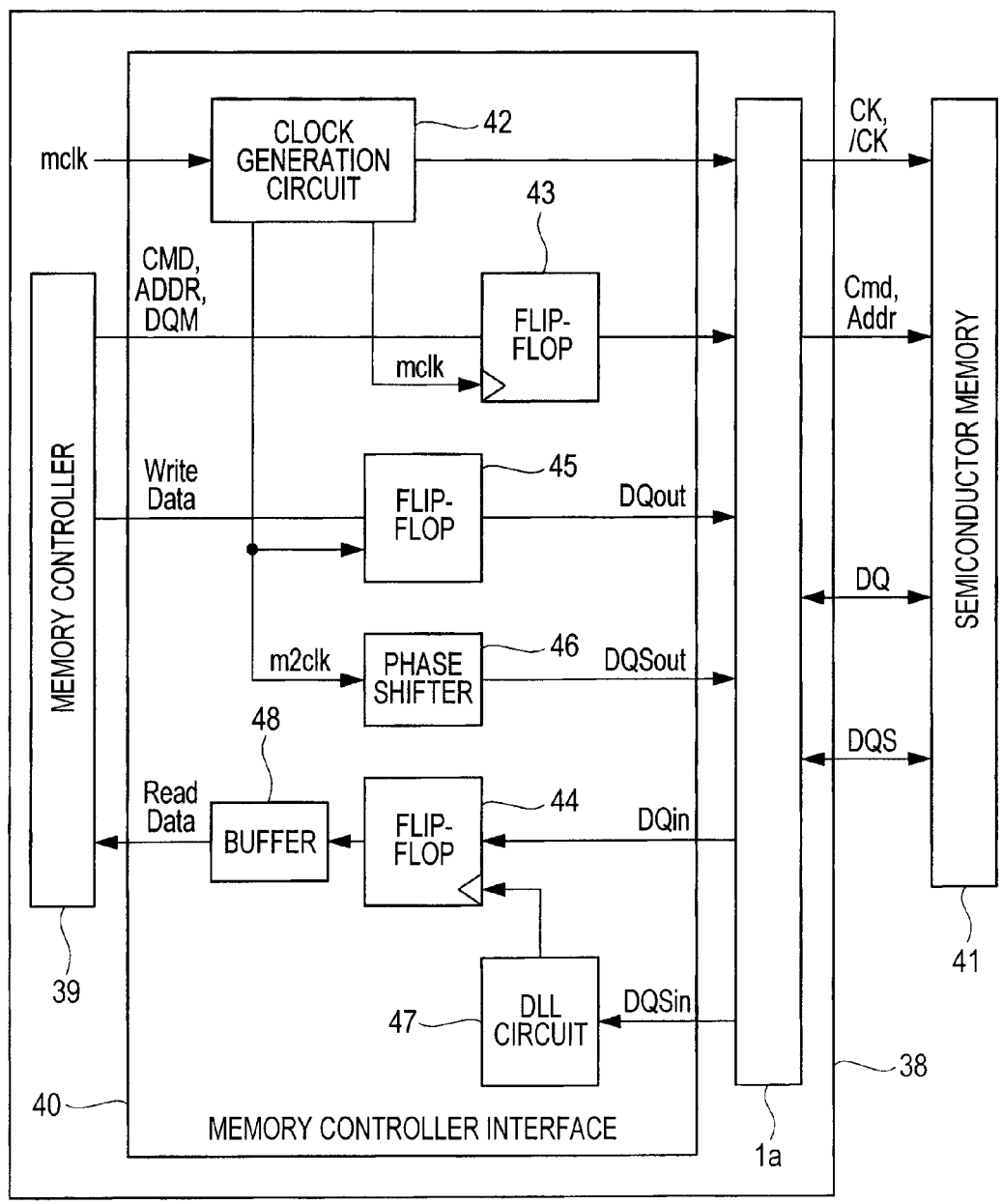
FIG. 7 is an explanatory drawing illustrating an example of a semiconductor device configured using the I/O cells in FIG. 2.

FIG. 1 is an explanatory drawing illustrating an example of the layout of I/O regions provided in a semiconductor chip in the first embodiment of the invention; FIG. 2 is an explanatory drawing illustrating an example of the configuration of two I/O cells provided in one of the I/O regions in FIG. 1; FIG. 3 is an explanatory drawing illustrating an example of the layout of an area where the I/O cells in FIG. 2 are placed; FIG. 4 is an explanatory drawing schematically illustrating a section taken along line A-A' of FIG. 3; FIG. 5 is an explanatory drawing schematically illustrating a section taken along line B-B' of FIG. 3; FIG. 6 is an explanatory drawing schematically illustrating a section taken along line C-C' of FIG. 3; and FIG. 7 is an explanatory drawing illustrating an example of a semiconductor device configured using the I/O cells in FIG. 2.

In the first embodiment, as illustrated in FIG. 1, an I/O region 1a is provided in each of the four sides of the semiconductor chip 1 provided in a semiconductor device. In the semiconductor chip 1, multiple internal circuits are formed so that they are surrounded with the I/O regions 1a. The internal circuits are made up of, for example, CPU, such peripheral circuits as an A/D converter and a timer, and the like.

In each of the I/O regions 1a, multiple I/O cells 2 as interfaces with external sources are linearly provided. Each of the I/O cells 2 is formed, for example, in a rectangular shape and they are linearly arranged so that their short sides on one side are in parallel with any one side of the semiconductor chip 1.

In the surface of the semiconductor chip 1, multiple area bumps made up of solder bumps or the like are formed. These area bumps form semiconductor devices with an area bump structure arranged in a grid pattern on the peripheral sides of the semiconductor chip 1 and inside them in each arbitrary rectangular area.

FIG. 2 is an explanatory drawing illustrating an example of the configuration of two I/O cells 2 (the area indicated by a broken line in FIG. 1) in the semiconductor chip 1 in FIG. 1. FIG. 2 shows only the output buffer portions of the I/O cells 2; however, the I/O cells 2 are also provided with an input buffer (not shown) that buffers external input signals.

Each of the I/O cells 2 is formed of a so-called complementary I/O cell that outputs one output signal as a complementary signal made up of a non-inverted signal and its inverted signal. Two I/O cells 2 are coupled in parallel to enhance driving force.

As illustrated in the drawing, each of the I/O cells 2 is made up of inverters 3 to 7 and a level-up shifter 8. The inverter 3 operates with an amplitude of supply voltage VDD-reference potential VSS and the inverters 4 to 7 operate with an amplitude of supply voltage VCCQ-reference potential VSS. These inverters 3 to 7 output a signal inputted from an input portion as an inverted signal from an output portion.

In the inverter 3 provided in each of the two I/O cells 2, the input portion of the inverter 3 has an input terminal din coupled thereto. In the left I/O cell 2, the output portion of the inverter 3 has the input portion of a level-up shifter 8 coupled thereto. The output portion of the level-up shifter 8 has the input portion of the inverter 4 coupled thereto. The input terminal din is inputted with signals outputted from a logic circuit of the semiconductor device.

The level-up shifters 8 converts the amplitude of supply voltage VDD-reference potential VSS into the amplitude of supply voltage VCCQ-reference potential VSS. Supply voltage VDD is the operating voltage of a logical circuit in the semiconductor device and its voltage level is, for example, 1.2V or so. The voltage level of supply voltage VCCQ is, for example, 1.5V or so and it is supplied as external power supply.

The output portion of the inverter 4 has the input portions of the inverters 5, 7 coupled thereto and the output portion of the inverter 7 has an output terminal padc1 coupled thereto. The output portion of the inverter 5 has the input portion of the inverter 6 coupled thereto and the output portion of the inverter 6 has an output terminal pad1 coupled thereto. The output terminal pad1 is a terminal to which the output signals of the I/O cell 2 are outputted and the output terminal padc1 is a terminal to which the inverted output signals of the I/O cell 2 are outputted.

The I/O cell 2 shown on the right side of FIG. 2 is identical in coupling configuration with the I/O cell 2 on the left side of FIG. 2, except the output portion of the inverter 6 is coupled to an output terminal pad2 and the output portion of the inverter 7 is coupled to an output terminal padc2.

The output terminal pad1 and the output terminal pad2 are coupled with each other through a wiring 17 made up of multiple wirings; and the output terminal padc1 and the output terminal padc2 are coupled with each other through a wiring 18 made up of multiple wirings.

The wiring 17 is coupled to an area bump terminal padT (FIG. 3) and the wiring 18 is coupled to an area bump terminal padcT (FIG. 3). As illustrated in the drawing, these wirings 17, 18 are so formed that wiring bent portions are bent at a bending angle of, for example, 45° or so, rather than 90°.

A power supply cell 21 is provided between the two I/O cells 2. This power supply cell 21 generates supply voltage VCCQ supplied to the inverters 5 to 7. Wirings 15, 16 (FIG. 3) are provided in the upper part of the two I/O cells 2. The wiring 15 is a wiring to which reference potential VSS is coupled and the wiring 16 is a wiring to which supply voltage VDD is coupled.

FIG. 3 is an explanatory drawing illustrating an example of the layout of an area where the I/O cells 2 in FIG. 2 are placed.

In the layout area of the I/O cell 2 shown on the left side of FIG. 3, area bumps 9 to 11 are laid out from top to bottom. In the layout area of the I/O cell 2 shown on the right side of the FIG. 3, area bumps 12 to 14 are laid out from top to bottom.

The area bump 9 is a bump to which reference potential VSS is coupled and the area bump 10 is a bump to which reference potential VSSQ is coupled. The area bump 11 is a bump to which the output signals of the I/O cell 2 are outputted.

The area bump 12 is a bump to which supply voltage VDD is coupled; the area bump 13 is a bump to which the inverted output signals of the I/O cell 2 are outputted; and the area bump 14 is a bump to which reference potential VCCQ is coupled.

The wiring 15 to which reference potential VSS is coupled is laid out above the area bumps 9, 12 and the wiring 16 to which supply voltage VDD is coupled is laid out above the wiring 15. The area bump 9 is coupled to the wiring 15 through a connecting terminal padvss and the area bump 12 is coupled to the wiring 16 through a connecting terminal padvdd.

The output terminal pad1 is formed at the upper left of the area bump 11 and the output terminal pad2 is formed at the upper left of the area bump 14. The output terminal padc1 is formed at the upper right of the area bump 11 and the output terminal padc2 is formed at the upper right of the area bump 14.

The area bump terminal padT is formed at the upper right part of the area bump 11 and the area bump terminal padcT is formed at the lower left part of the area bump 13. The output terminal pad1, output terminal pad2, and area bump terminal padT are coupled with one another through the wiring 17.

The output terminal padc1, output terminal padc2, and area bump terminal padcT are coupled with one another through the wiring 18. In the two I/O cells 2, as mentioned above, the output terminals pad1, pad2, and the output terminals padc1, padc2 are respectively coupled in common. Signals outputted from the two I/O cells 2 are outputted and driving force is thereby enhanced.

The wiring 17 is so formed that it is astride the two I/O cells 2 on the lower side of the layout areas of the I/O cells 2 in FIG. 3. The wiring 18 is formed above the wiring 17 so that it is astride the two I/O cells 2 similarly to the wiring 17. The wiring 17 and the wiring 18 are laid out so that they are substantially identical in wiring length.

The area bump terminal padT is laid out so that it is located substantially at the midpoint between the output terminal pad1 and the output terminal pad2. The area bump terminal padcT is similarly laid out so that it is located substantially at the midpoint between the output terminal padc1 and the output terminal padc2.

This layout makes it possible to make the wiring loads in the area bump terminals padT, padcT substantially equal to each other and prevent disturbance in output waveform in the I/O cells 2. Delay in signals outputted from the area bump terminals padT, padcT and the like can be prevented by making the wiring 17 and the wiring 18 equal to each other in wiring length.

The bent portions in the wirings 17, 18 are so formed that their bending angle is as gentle as 45° or so. As a result, the wiring length can be reduced as compared with cases where the bent portions in the wirings are bent at 90° and it is possible to reduce electro-current constriction at the bent portions in the wirings.

In the substantially central parts of the layout areas in the two I/O cells 2 in FIG. 3, wirings 19, 20 to which reference potential VSSQ is coupled are respectively laid out from top to bottom.

The wiring 19 laid out in the left I/O cell 2 has the area bump 10 coupled thereto through a connecting terminal padvssq. The wiring 20 laid out in the right I/O cell 2 has the area bump 10 formed over an I/O cell 2 (not shown) laid out on the right side of the I/O cell 2 coupled thereto through a connecting terminal padvssq.

Between the two I/O cells 2, the power supply cell 21 that generates supply voltage VCCQ supplied to the inverters 5 to 7 (FIG. 2) is laid out from top to bottom. The input terminal din is formed at the upper part of the power supply cell 21.

The input terminal din is also laid out so that the following wiring lengths are substantially equal to each other: the wiring length from the input portion of the inverter 3 provided in the left I/O cell 2 to the input terminal din; and the wiring length from the input portion of the inverter 3 provided in the right I/O cell 2 to the input terminal din. This makes it possible to reduce delay in signals inputted to the left and right inverters 3. A power supply terminal padvccq formed at the lower part of the power supply cell 21 has the area bump 14 coupled thereto.

FIG. 4 to FIG. 6 are sectional views schematically illustrating a section taken along line A-A' of FIG. 3, a section taken along line B-B', and a section taken along line C-C'.

As illustrated in FIG. 4 to FIG. 6, the semiconductor chip 1 has a multilayer wiring structure and includes a semiconductor layer 22 in which MISFET and the like are formed in the lowermost layer of the semiconductor chip 1.

Above the semiconductor layer 22, there is formed a first-layer wiring 24 predominantly comprised of copper electrically coupled to the semiconductor layer 22 through a tungsten plug 23. Above the first-layer wiring 24, there is formed a second layer-wiring 26 predominantly comprised of copper electrically coupled thereto through a copper plug 25. The wirings 19, 20 to which reference potential VSSQ is coupled are formed in the second-layer wiring 26.

Above the second-layer wiring 26, there is formed a third-layer wiring 28 predominantly comprised of copper electrically couple thereto through a copper plug 27. Above the third-layer wiring 28, there is formed a fourth-layer wiring 30 predominantly comprised of copper electrically coupled thereto through a copper plug 29.

Above the fourth-layer wiring 30, there is formed a fifth-layer wiring 32 predominantly comprised of copper electrically coupled thereto through a copper plug 31. The wiring 15 to which reference potential VSS is coupled and the wiring 16 to which supply voltage VDD is coupled are formed in the fifth-layer wiring 32.

Above the fifth-layer wiring 32, there is formed a sixth-layer wiring 34 predominantly comprised of copper electrically coupled thereto through a copper plug 33. In the sixth-layer wiring 34, the following wirings are formed: the wiring 17 to which the output terminal pad1, output terminal pad2, and area bump terminal padT are coupled and the wiring 18 to which the output terminal padc1, output terminal padc2, and area bump terminal padcT are coupled. Above the sixth-layer wiring 34, there is formed a seventh-layer wiring 36 predominantly comprised of copper electrically coupled thereto through a copper plug 35.

An insulating film, not shown, such as, for example, a silicon oxide film is formed in the following areas (between wiring layers): the area between the semiconductor layer 22 and the first-layer wiring 24; the area between the first-layer wiring 24 and the second-layer wiring 26; the area between the second-layer wiring 26 and the third-layer wiring 28; the area between the third-layer wiring 28 and the fourth-layer wiring 30; the area between the fourth-layer wiring 30 and the fifth-layer wiring 32; the area between the fifth-layer wiring 32 and the sixth-layer wiring 34; and the area between the sixth-layer wiring 34 and the seventh-layer wiring 36.

Above the seventh-layer wiring 36, a rewiring layer 37 is formed. This rewiring layer 37 is a wiring layer predominantly comprised of copper, electrically coupled to the seventh-layer wiring 36 through barrier metal such as Cr (chromium)/Ni (nickel).

Over the rewiring layer 37, an organic insulating film of polyimide or the like is further formed though not shown in the drawings. Part of the organic insulating film of polyimide or the like is opened and such round land-shaped surface of the rewiring as illustrated in the drawings is exposed. The rewiring layer 37 is turned into pads for bump over which an area bump is formed, connecting terminals, input terminals, or output terminals to which the pads for bump are coupled, and the like.

For example, the rewiring layers 37 in FIG. 4 are pads for bump over which the area bumps 9 to 11 are formed from left to right; the rewiring layers 37 in FIG. 5 are turned into the connecting terminal padvssq, power supply terminal padvccq, and connecting terminal padvssq from right to left; and the rewiring layer 37 in FIG. 6 is turned into the power supply terminal padvccq.

FIG. 7 is an explanatory drawing illustrating an example of a semiconductor device 38 configured using I/O cells 2.

The semiconductor device 38 includes an I/O region 1a having I/O cells 2 (FIG. 2), a memory controller 39, a memory controller interface 40, CPU (not shown), a logic circuit (not shown), and the like. The semiconductor device 38 is externally coupled with a semiconductor memory 41.

The semiconductor memory 41 is made up of, for example, a volatile memory, such as DDR-DRAM (Double-Data-Rate Synchronous Dynamic Random Access Memory) having a high-speed data transfer function designated as double data rate (DDR) mode.

The memory controller 39 controls everything including read operation/write operation in the semiconductor memory 41. The memory controller interface 40 is an interface between the memory controller 39 and the semiconductor memory 41.

The memory controller interface 40 is made up of a clock generation circuit 42, flip-flops 43, 44, 45, a phase shifter 46, a DLL (Delay Locked Loop) circuit 47, and a buffer 48.

Description will be given to write operation for writing data to the semiconductor memory 41.

In write operation for writing data to the semiconductor memory 41, first, an internal command CMD, an address ADDR, and internal data DQM are outputted from the memory controller 39 to the memory controller interface 40 in synchronization with internal clock mclk.

The flip-flop 45 generates data DQout synchronized with an internal clock signal m2clk generated by the clock generation circuit 42 based on the inputted internal command CMD, address ADDR, and internal data DQM.

The data DQout is delayed in phase from the internal clock signal mclk by a ¼ period (=90°). The clock generation circuit 42 generates an internal clock signal m2clk whose period is ½ of that of the inputted internal clock signal mclk from the internal clock signal mclk.

The flip-flop 43 generates an external command Cmd and an address Addr respectively based on the internal command CMD and the address ADDR. Meanwhile, in a combined logical circuit (not shown) inputted with the internal clock signal mclk and the internal command CMD, a clock signal DQSout used in write data DQ is generated. This clock signal DQSout is a signal synchronized with the internal clock signal m2clk.

Then the clock signal DQSout is outputted to the semiconductor memory 41 through the output buffer portion of an I/O cell 2. The data DQ is delayed in phase from the clock signal DQS by 90°. At the semiconductor memory 41, therefore, a setup/hold period is ensured and the data DQ is taken in in accordance with the clock signal DQS.

Description will be given to read operation for reading data from the semiconductor memory 41.

In this case, data DQ, and a clock signal DQS are sent from the semiconductor memory 41 to an I/O cell 2 in an identical phase (at an identical rising edge and an identical falling edge). The data DQ and the clock signal DQS are taken into the memory controller interface 40 by way of the I/O cell 2 (indicated by data DQin and clock signal DQSin in the drawing).

Subsequently, the clock signal DQSin is delayed in phase by 90° by the DLL circuit 47. Thereafter, the flip-flop 44 takes in the data DQin in synchronization with the clock signal DQSin and the data DQin is outputted to the memory controller 39 through the buffer 48 with a FIFO (Fast In Fast Out) configuration.

According to the first embodiment, as mentioned above, it is possible to make the wiring loads in the area bumps terminals padT, padcT substantially equal and thus obtain an ideal output waveform.

Further, since electro-current constriction in the bent portions in the wirings 17, 18 and the like can be reduced, the reliability of each I/O cell 2 can be enhanced.

Second Embodiment

Figure 8:
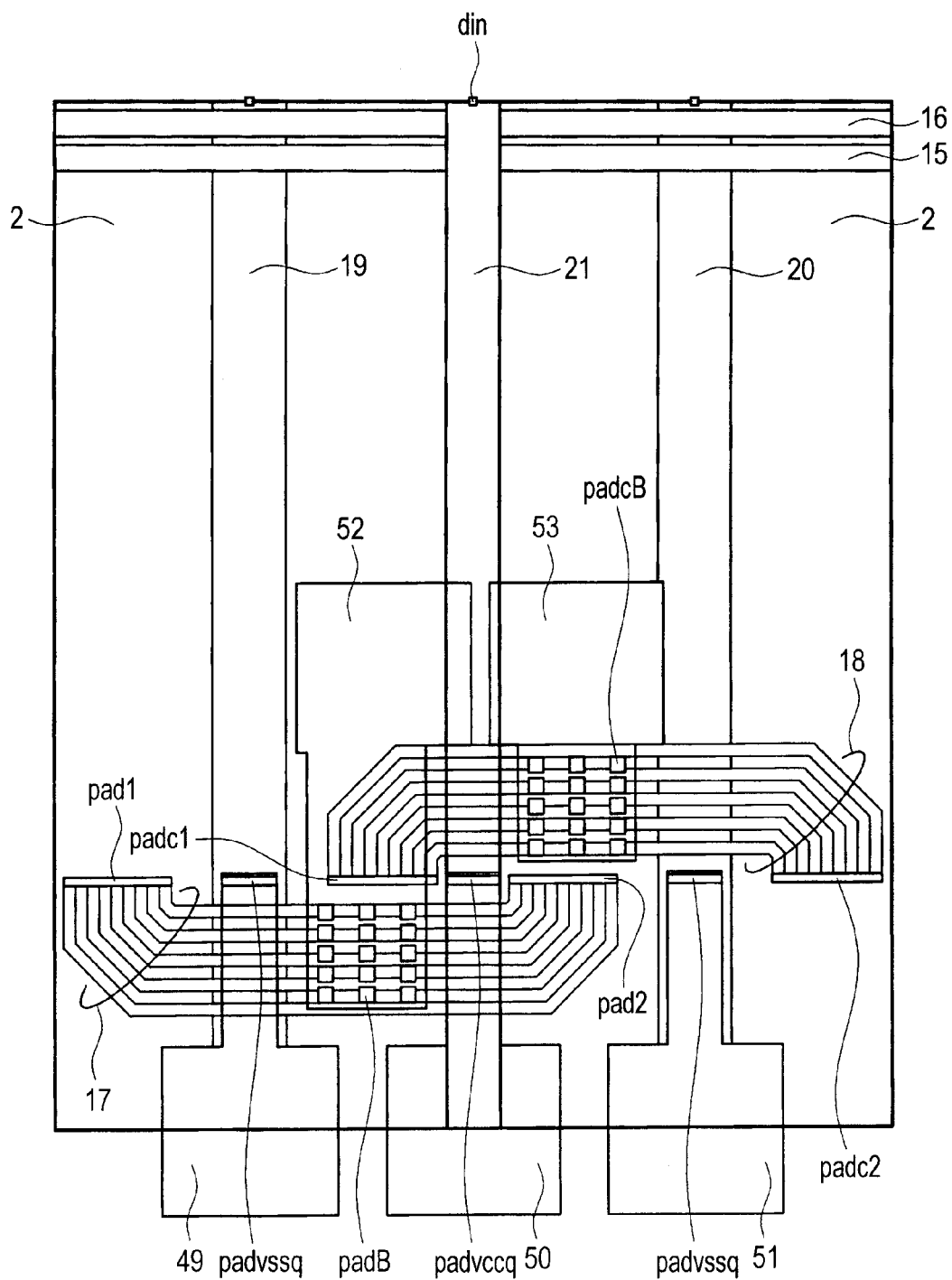
FIG. 8 is an explanatory drawing illustrating an example of the layout of an area where I/O cells are placed in a second embodiment of the invention.

FIG. 8 is an explanatory drawing illustrating an example of the layout of an area where I/O cells are placed in the second embodiment of the invention.

FIG. 3 referred to in relation to the first embodiment illustrates a configuration in which the area bumps 9 to 14 are formed above the I/O cells 2. In the second embodiment, as illustrated in FIG. 8, bonding pads 49 to 53 to which a bonding wire is bonded are formed in place of area bumps.

In FIG. 8, a bonding pad 49 is laid out below the central part of the left I/O cell 2 and a bonding pad 50 is laid out astride the lower right side of the left I/O cell 2 and the lower left side of the right I/O cell 2.

A bonding pad 51 is laid out below the central part of the right I/O cell 2. A bonding pad 52 is laid out on the right side of the central part of the left I/O cell 2 and a bonding pad 53 is laid out on the left side of the central part of the right I/O cell 2.

The bonding pads 49, 51 are coupled to the connecting terminals padvssq and the bonding pad 50 is coupled to the power supply terminal padvccq. The bonding pad 52 is coupled to a bonding pad terminal padB and the bonding pad 53 is coupled to a bonding pad terminal padcB.

The bonding pad terminal padB is coupled to the wiring 17 with which the output terminal pad1 and the output terminal pad2 are coupled; and the bonding pad terminal padcB is coupled to the wiring 18 with which the output terminal padc1 and the output terminal padc2 are coupled.

A bonding wire is bonded to these bonding pads 49 to 53 and they are coupled to I/O terminals provided in the semiconductor device through the bonding wires. The other respects in coupling configuration are the same as those in FIG. 3 and the description thereof will be omitted.

Also in this case, the wiring 17 and the wiring 18 are laid out so that they are substantially identical in wiring length. The wirings 17, 18 are so formed that the angle of the bent portions in them is 45° or so.

The bonding pad terminal padB is laid out so that it is located substantially at the midpoint between the output terminal pad1 and the output terminal pad2; and the bonding pad terminal padcB is laid out so that it is located substantially at the midpoint between the output terminal padc1 and the output terminal padc2.

This makes it possible to prevent delay in signals outputted from the bonding pad terminals padB, padcB and make the wiring loads in the bonding pad terminals padB, padcB substantially equal to each other.

Third Embodiment

Figure 9:
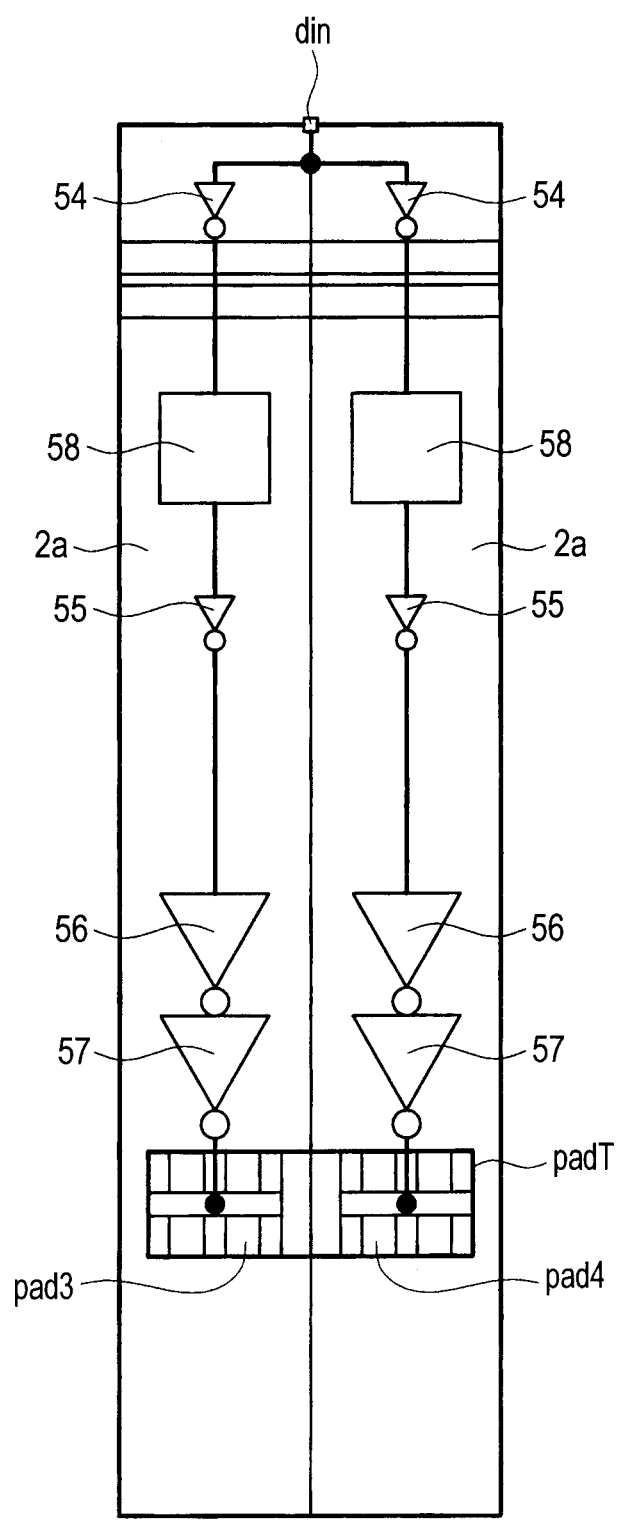
FIG. 9 is an explanatory drawing illustrating an example of the configuration of I/O cells in a third embodiment of the invention.
Figure 10:
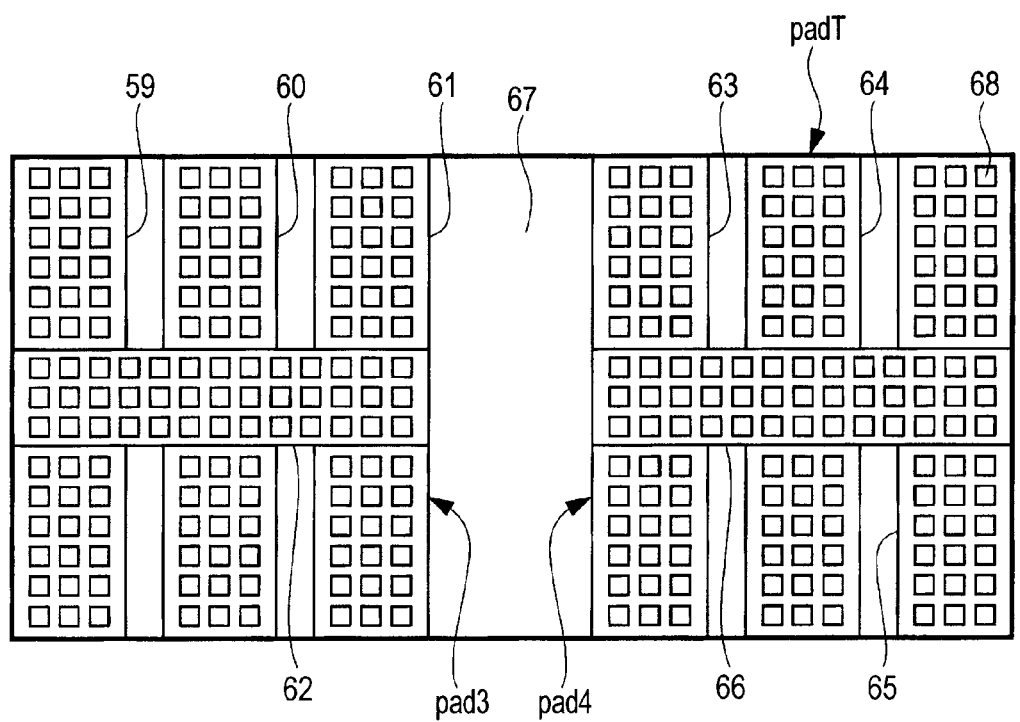
FIG. 10 is an explanatory drawing illustrating an example of the configuration of area bump terminals coupled to the I/O cells in FIG. 9.
Figure 11:
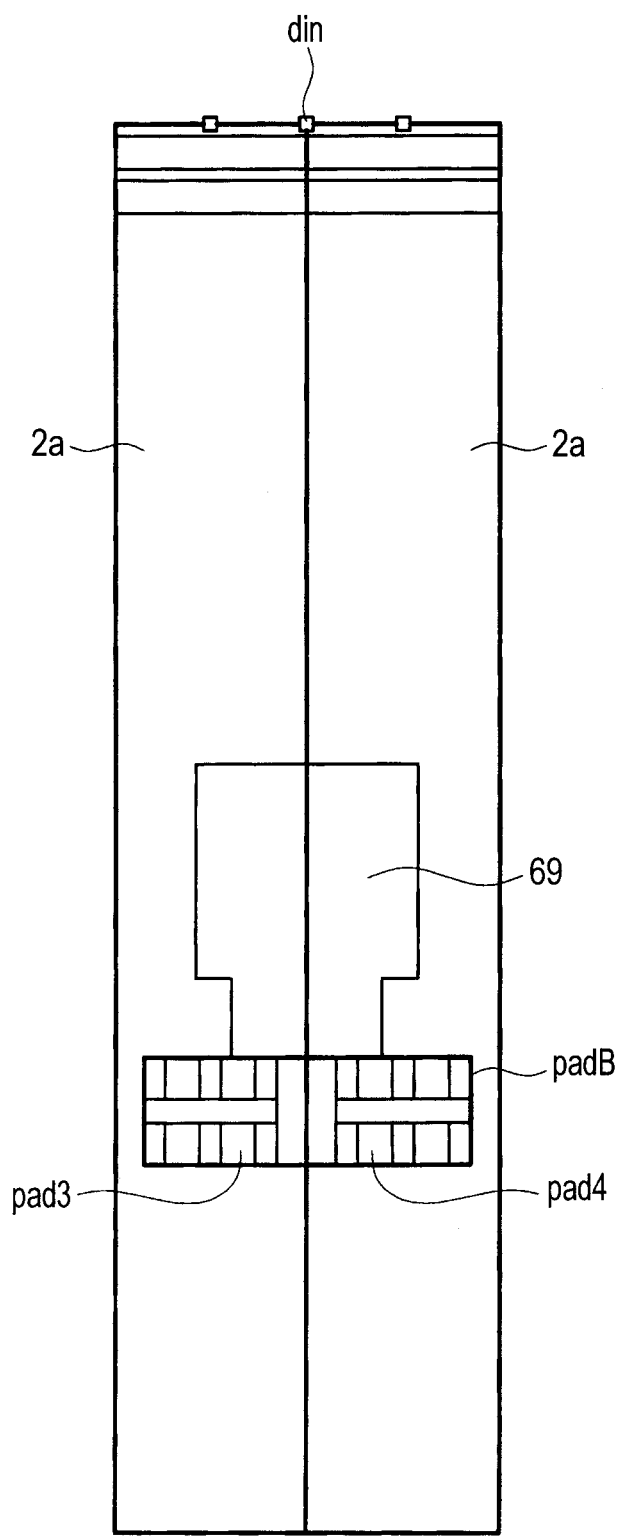
FIG. 11 is an explanatory drawing illustrating an example of a configuration in which a bonding pad coupled to the I/O cells in FIG. 9 is formed.

FIG. 9 is an explanatory drawing illustrating an example of the configuration of I/O cells in the third embodiment of the invention; FIG. 10 is an explanatory drawing illustrating an example of the configuration of area bump terminals coupled to the I/O cells in FIG. 9; and FIG. 11 is an explanatory drawing illustrating an example of a configuration in which a bonding pad coupled to the I/O cells in FIG. 9 is formed.

In the description of the third embodiment, another configuration of the I/O cell 2 will be taken as an example. In the first embodiment, each I/O cell 2 is formed of a complementary I/O cell that outputs one output signal as a complementary signal made up of a non-inverted signal and its inverted signal; and the I/O cells 2 are coupled in parallel. Meanwhile, the I/O cells 2a illustrated in FIG. 9 are formed of a single I/O cell that does not output a complementary signal but outputs an inputted output signal only as a non-inverted signal. The two I/O cells 2a are coupled in parallel.

Each of the I/O cells 2a is made up of inverters 54 to 57 and a level-up shifter 58. The inverters 54 operate with an amplitude of supply voltage VDD-reference potential VSS and the inverters 55 to 57 operate with an amplitude of supply voltage VCCQ-reference potential VSS. These inverters 54 to 57 output signals inputted from an input portion as inverted signals from an output portion.

The input portion of the inverter 54 provided in each of the two I/O cells 2a has an input terminal din coupled thereto. The output portion of the inverter 57 provided in each of the two I/O cells 2a has an output terminal pad3, pad4 coupled thereto.

The output portion of each inverter 54 has the input portion of a level-up shifter 58 coupled thereto and the output portion of this level-up shifter 58 has the input portion of an inverter 55 coupled thereto. Each of the level-up shifters 58 converts the amplitude of supply voltage VDD-reference potential VSS into the amplitude of supply voltage VCCQ-reference potential VSS.

The output portion of each of the inverters 55 has the input portion of an inverter 56 coupled thereto and the output portion of this inverter 56 has the input portion of an inverter 57 coupled thereto. The output portion of each of the inverters 57 has an area bump terminal padT including output terminals pad3, pad4 as terminals for outputting the output signals of the I/O cell 2a coupled thereto.

FIG. 10 is an explanatory drawing illustrating an example of the configuration of an area bump terminal padT.

The output terminal pad3 shown on the left side of FIG. 10 is made up of wirings 59 to 62. The wiring 59 is formed from top to bottom on the left side of FIG. 10; and the wiring 61 is formed from top to bottom on the right side of the output terminal provided on the left side of FIG. 10. The wiring 60 is formed between the wiring 59 and the wiring 61 and these wirings 59 to 61 are so provided that they are placed at equal intervals. The wiring 62 is so formed that it is astride the wiring 59 and the wiring 61.

The output terminal pad4 shown on the right side of FIG. 10 is made up of wirings 63 to 66. The wiring 63 is formed from top to bottom on the left side of the output terminal provided on the right side of FIG. 10; and the wiring 65 is formed from top to bottom on the right side of FIG. 10. The wiring 64 is formed between the wiring 63 and the wiring 65. These wirings 63 to 65 are also formed at equal intervals. The wiring 66 is so formed that it is astride the wiring 63 and the wiring 65.

The wirings 59 to 62 and the wirings 63 to 66 are formed in, for example, the sixth-layer wiring formed in the semiconductor chip. Above the output terminal pad3 formed of the wirings 59 to 62 and the output terminal pad4 formed of the wirings 63 to 66, there is formed the area bump terminal padT formed in, for example, the seventh-layer wiring.

The area bump terminal padT is the area surrounded with the heavy line shown in the drawing and the entire area in the heavy line is formed of a wiring 67 formed in the seventh-layer wiring. The wiring 67 and the wirings 59 to 66 are coupled with each other through multiple vias 68.

It is possible to reduce the coupling resistance and disperse a current by coupling the output terminals pad3, pad4 to the area bump terminal padT through the multiple vias 68 as mentioned above.

Also in this case, the input terminal din (FIG. 9) is laid out so that the following wiring lengths are substantially equal: the wiring length between the input portion of the inverter 54 provided in the left I/O cell 2a and the input terminal din; and the wiring length between the input portion of the inverter 54 provided in the right I/O cell 2a and the input terminal din.

This makes it possible to disperse a current applied to the output terminal pad3 and the output terminal pad4 when a signal is outputted from an I/O cell 2a and prevent insufficient insulation and the like due to electromigration.

FIG. 11 is an explanatory drawing illustrating an example of a configuration in which a bonding pad 69 to which a bonding wire is bonded is formed above I/O cells 2a.

In FIG. 11, the bonding pad 69 is provided in proximity to the central parts of two I/O cells 2a. This bonding pad 69 is coupled with an I/O terminal provided in the semiconductor device through a bonding wire.

A bonding pad terminal padB is provided below the bonding pad 69. The other respects in coupling configuration are the same as those in FIG. 9 and the description thereof will be omitted. The configuration of the bonding pad terminal padB is also the same as that of the area bump terminal padT in FIG. 10 and the description thereof will be omitted.

This also makes it possible to disperse a current applied to the output terminal pad3 and the output terminal pad4 when a signal is outputted from an I/O cell 2a and prevent insufficient insulation and the like due to electromigration.

In the third embodiment, the reliability of the I/O cells 2a can be enhanced by the foregoing.

Fourth Embodiment

Figure 12:
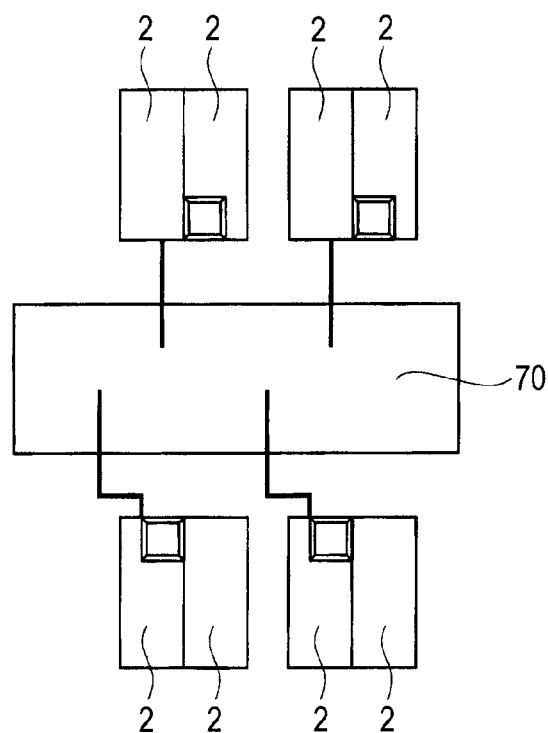
FIG. 12 is an explanatory drawing illustrating an example of the layout of I/O cells in a fourth embodiment of the invention.
Figure 13:
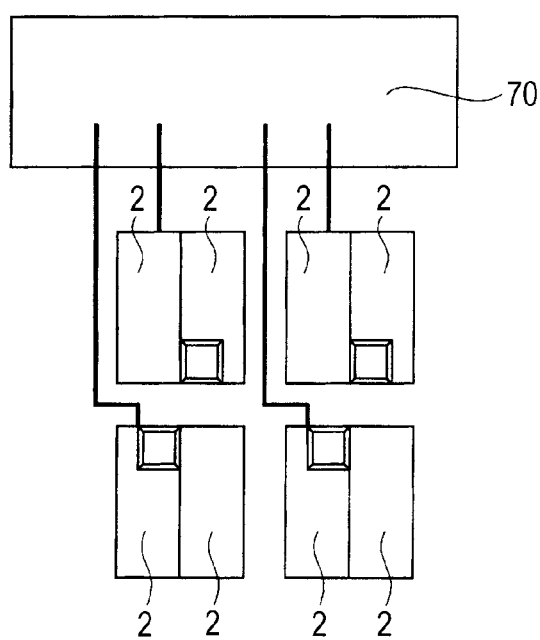
FIG. 13 is an explanatory drawing illustrating another example of the layout of the I/O cells in FIG. 12.

FIG. 12 is an explanatory drawing illustrating an example of the layout of I/O cells in the fourth embodiment of the invention; and FIG. 13 is an explanatory drawing illustrating another example of the layout of the I/O cells in FIG. 12.

In the description of the fourth embodiment, other layouts of I/O cells 2 will be taken as examples. The first embodiment is so configured that I/O cells 2 are linearly provided along the periphery of the semiconductor chip 1 (FIG. 1). Meanwhile, this embodiment is so configured that I/O cells 2 are so provided as to sandwich a logical circuit block 70 between them as illustrated in, for example, FIG. 12.

The logical circuit block 70 is a block that inputs or outputs signals to or from two I/O cells 2 coupled in parallel. Multiple linearly provided I/O cells 2 are laid out above and below the logical circuit block 70.

The following can be implemented by placing I/O cells 2 above and below the logical circuit block 70 as mentioned above: the layout length in the directions of the sides of the semiconductor chip can be reduced as compared with the case illustrated in FIG. 2 where I/O cells 2 are linearly arranged.

The linearly arranged I/O cells 2 may be laid out in two rows below the logical circuit block 70 as illustrated in, for example, FIG. 13.

In the fourth embodiment, thus, the layout length of I/O cells 2 (in the directions of the sides of the semiconductor chip) can be shortened; therefore, the semiconductor chip can be reduced in size.

Up to this point, description has been given to the invention made by the present inventors based on embodiments of the invention. However, the invention is not limited to the above embodiments and can be variously modified without departing from the subject matter thereof.

The invention is suitable for semiconductor devices using an I/O buffer with a parallel drive configuration in which I/O cells are coupled in parallel.

What is claimed is:

1. A semiconductor device comprising:
   a semiconductor chip having a main surface;
   a plurality of input/output circuit cells formed along the periphery of the main surface;
   an internal circuit formed in the main surface so that the internal circuit is surrounded with the input/output circuit cells; and
   a plurality of electrode pads placed in areas corresponding to each of the input/output circuit cells,
   wherein the input/output circuit cells include:
   a first input/output circuit cell and a second input/output circuit cell placed adjacently to each other; and
   a first electrode pad and a second electrode pad placed in areas respectively corresponding to the first and second input/output circuit cells with a predetermined distance in between,
   wherein the first and second input/output circuit cells include a first inverter circuit and a second inverter circuit that output complementary signals different in phase from each other according to an identical signal outputted from the internal circuit,
   wherein the output of the first inverter circuit of the first input/output circuit cell and the output of the first inverter circuit of the second input/output circuit cell are coupled in common to the first electrode pad through a first wiring located below a wiring layer comprising the first electrode pad,
   wherein the output of the second inverter circuit of the first input/output circuit cell and the output of the second inverter circuit of the second input/output circuit cell are coupled in common to the second electrode pad through a second wiring formed in the same layer as the first wiring,
   wherein the first electrode pad is placed between the output of the first inverter circuit of the first input/output circuit cell and the output of the first inverter circuit of the second input/output circuit cell in a direction along the periphery of the semiconductor chip, wherein the second electrode pad is placed between the output of the second inverter circuit of the first input/output circuit cell and the output of the second inverter circuit of the second input/output circuit cell in a direction along the periphery of the semiconductor chip,
   wherein the first wiring coupling together the first electrode pad and the output of the first inverter circuit of the second input/output circuit cell is so formed that the first wiring is astride areas where the first and second input/output circuit cells are formed, and
   wherein the second wiring coupling together the second electrode pad and the output of the second inverter circuit of the first input/output circuit cell is so formed that the second wiring is astride areas where the first and second input/output circuit cells are formed.

2. The semiconductor device according to claim 1,
   wherein a power supply cell is formed between the first and second input/output circuit cells,
   wherein the first wiring coupling together the first electrode pad and the output of the first inverter circuit of the second input/output circuit cell is so formed that the first wiring is astride the area located over the power supply cell, and
   wherein the second wiring coupling together the second electrode pad and the output of the second inverter circuit of the first input/output circuit cell is so formed that the second wiring is astride the area located over the power supply cell.

3. The semiconductor device according to claim 2,
   wherein the first and second electrode pads are placed on both sides of the power supply cell with the power supply cell in between.

4. The semiconductor device according to claim 3,
   wherein the first and second electrode pads are formed of a metal film predominantly comprised of aluminum.

5. The semiconductor device according to claim 4, further comprising:
   a rewiring layer coupled to each of the first and second electrode pads,
   wherein a solder bump is formed over the rewiring layer.

6. The semiconductor device according to claim 1,
   wherein the identical signal outputted from the internal circuit is a clock signal.

* * * * *